US006977185B2

(12) United States Patent

Bryant et al.

(10) Patent No.: US 6,977,185 B2
(45) Date of Patent: Dec. 20, 2005

(54) PRINTHEAD INTEGRATED CIRCUIT

(75) Inventors: Frank R. Bryant, Denton, TX (US); Joseph M. Torgerson, Philomath, OR (US); Angela White Bakkom, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 261 days.

(21) Appl. No.: 10/214,081

(22) Filed: Aug. 6, 2002

(65) Prior Publication Data

US 2002/0190328 A1 Dec. 19, 2002

Related U.S. Application Data

(62) Division of application No. 09/813,087, filed on Mar. 19, 2001, now Pat. No. 6,883,894.

(51) Int. Cl.[7] .......... H01L 21/00

(52) U.S. Cl. .......... 438/21; 347/20; 347/40

(58) Field of Search .......... 438/21; 347/20, 347/12, 40

(56) References Cited

U.S. PATENT DOCUMENTS

| | | | | |
|---|---|---|---|---|
| 3,315,096 A | | 4/1967 | Carlson et al. | 307/88.5 |
| 3,608,189 A | | 9/1971 | Gray | 29/571 |
| 3,868,721 A | | 2/1975 | Davidsohn | 357/41 |
| 4,063,274 A | | 12/1977 | Dingwall | 357/53 |
| 4,142,197 A | | 2/1979 | Dingwall | 357/23 |
| 4,173,022 A | | 10/1979 | Dingwall | 357/23 |
| 4,240,093 A | | 12/1980 | Dingwall | 357/42 |
| 4,272,881 A | | 6/1981 | Angle | 29/571 |
| 4,274,193 A | | 6/1981 | Angle | 29/571 |
| 4,308,549 A | | 12/1981 | Yeh | |
| 4,561,170 A | | 12/1985 | Doering et al. | 29/571 |
| 4,696,092 A | | 9/1987 | Doering et al. | 437/5 |
| 4,697,328 A | | 10/1987 | Custode | 437/41 |
| 5,122,812 A | | 6/1992 | Hess et al. | 346/1.1 |
| 5,147,812 A | * | 9/1992 | Gilbert et al. | 438/177 |
| 5,159,353 A | | 10/1992 | Fasen et al. | 346/140 R |
| 5,305,015 A | * | 4/1994 | Schantz et al. | 347/47 |
| 5,310,692 A | | 5/1994 | Chan et al. | 437/41 |
| 5,870,121 A | * | 2/1999 | Chan | 347/59 |
| 5,874,769 A | | 2/1999 | Chan et al. | 257/510 |
| 5,883,650 A | * | 3/1999 | Figueredo et al. | 347/62 |
| 6,019,907 A | * | 2/2000 | Kawamura | 216/27 |
| 6,034,410 A | | 3/2000 | Chan et al. | 257/510 |
| 6,102,528 A | * | 8/2000 | Burke et al. | 347/59 |
| 6,183,067 B1 | * | 2/2001 | Matta | 347/65 |

FOREIGN PATENT DOCUMENTS

| | | |
|---|---|---|
| EP | 0574911 A2 | 12/1993 |
| EP | 0641658 A2 | 3/1995 |

OTHER PUBLICATIONS

HP Journal, Feb. 1994, vol. 45, No. 1, pp 41-45, The Third-Generation HP Thermal InkJet Printhead. J. Aden, et al.

* cited by examiner

*Primary Examiner*—Maria F. Guerrero
(74) *Attorney, Agent, or Firm*—Timothy F. Myers

(57) ABSTRACT

An integrated circuit is formed on a substrate. The integrated circuit includes a transistor formed in the substrate. The transistor has a gate that forms at least one closed-loop. The integrated circuit also includes an ejection element that is coupled to the transistor wherein the ejection element is disposed over the substrate without an intervening field oxide layer.

6 Claims, 7 Drawing Sheets

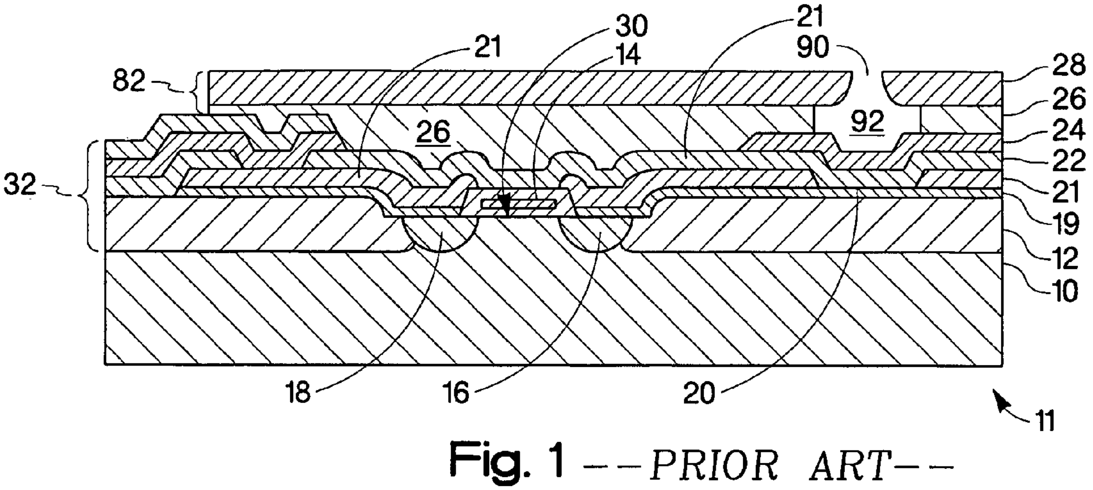
Fig. 1 --PRIOR ART--
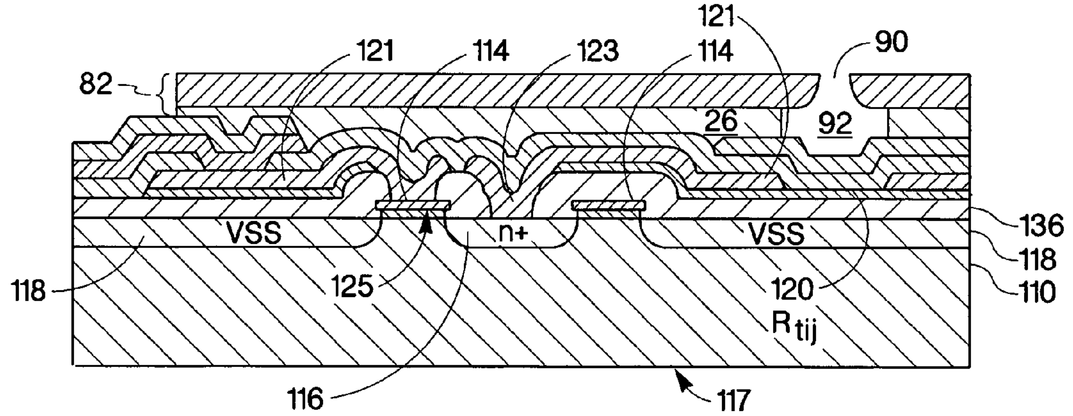
Fig. 2
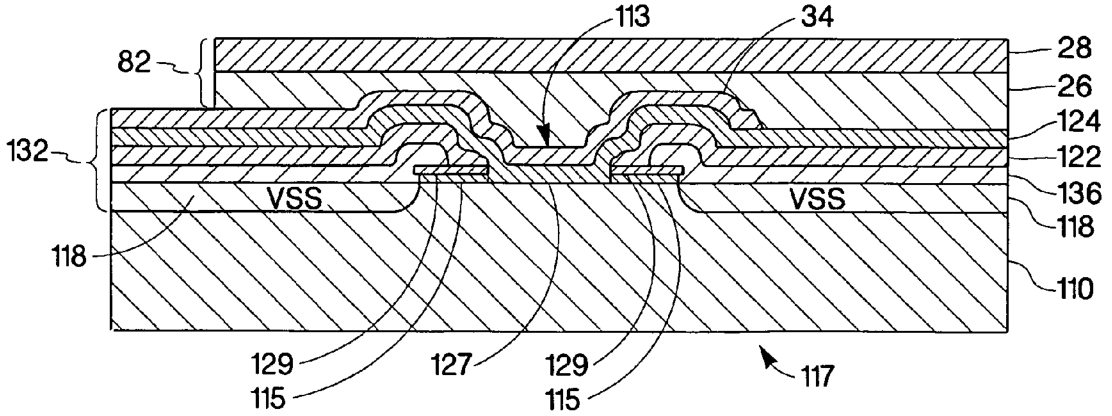
Fig. 3

PRINTHEAD INTEGRATED CIRCUIT

CROSS REFERENCE TO RELATED APPLICATION(S)

This is a divisional of application Ser. No. 09/813,087 filed on Mar. 19, 2001, now U.S. Pat. No. 6,883,894, which is hereby incorporated by reference herein.

FIELD OF THE INVENTION

This invention relates to the field of semiconductor integrated circuit devices, processes for making those devices and systems utilizing those devices. More specifically, the invention relates to a combined MOS and ejection element printhead integrated circuit for fluid jet recording.

BACKGROUND OF THE INVENTION

MOS (metal oxide semiconductors) integrated circuits are finding increased use in electronic applications such as printers. Combining the driver circuitry (the MOS transistors) and the ejection elements (for example, a resistor) requires the hybridization of conventional integrated circuit (IC) and fluid-jet technology. Several different processes for combining the IC and fluid-jet technology exist but can be expensive and usually require a significant amount of process steps that might introduce defects into the final product.

In competitive consumer markets such as with printers and photo plotters, costs must continually be reduced in order to stay competitive and profitable. Further, the consumers increasingly expect reliable products because the cost of repair for customers is often times higher than the cost of replacing the product. Therefore, to increase reliability and reduce costs, improvements are required in the manufacturing of integrated circuits for printheads that combine MOS transistors and ejection elements.

SUMMARY

An integrated circuit is formed on a substrate. The integrated circuit includes a transistor formed in the substrate. The transistor has a gate that forms at least one closed-loop. The integrated circuit also includes an ejection element that is coupled to the transistor wherein the ejection element is disposed over the substrate without an intervening field oxide layer.

By changing the layout of the transistor gate regions, the integrated circuit is fabricated such that an island mask is not required to define active regions of the transistor. The layout change requires that the gates of the transistors be formed using closed-loop structures of one or more loops. Changing the layout and not using an island mask to define the active regions during fabrication achieves several benefits. There is reduced cost from a reduced number of process steps required to create the integrated circuit. By reducing the number of process steps, risk of failures due to the introduction of contaminants is reduced thus increasing yield and reliability. Reduced process steps also reduce the chemical usage per wafer in fabrication and increases the total number of wafers processed in a fixed time or with a fixed equipment set.

BRIEF DESCRIPTION OF THE DRAWINGS

FIG. 1 is an exemplary cross-section of a conventional integrated circuit that combines a transistor and ejection element.

FIG. 2 is an exemplary cross-section of an embodiment of the invention illustrating the cross-section of a closed-loop transistor and the ejection element.

FIG. 3 is an exemplary cross-section of an optional substrate contact used in an alternative embodiment of the invention.

DETAILED DESCRIPTION OF THE PREFERRED AND ALTERNATE EMBODIMENTS

Figure 4:
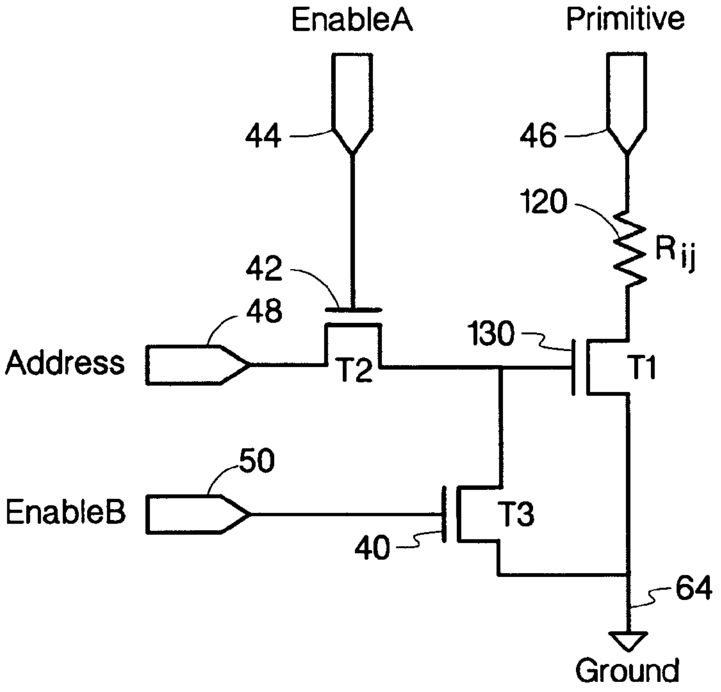
FIG. 4 is an exemplary schematic of a transistor circuit used to selectively control an ejection element.

The semiconductor devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

Further various parts of the semiconductor elements have not been drawn to scale. Certain dimensions have been exaggerated in relation to other dimensions in order to provide a clearer illustration and understanding of the present invention. For the purposes of illustration the preferred embodiment of semiconductor devices of the present invention have been shown to include specific p and n type regions, but it should be clearly understood that the teachings herein are equally applicable to semiconductor devices in which the conductivities of the various regions have been reversed, for example, to provide the dual of the illustrated device.

In addition, although the embodiments illustrated herein are shown in two-dimensional views with various regions having depth and width, it should be clearly understood that these regions are illustrations of only a portion of a single cell of a device, which may include a plurality of such cells arranged in a three-dimensional structure. Accordingly, these regions will have three dimensions, including length, width, and depth, when fabricated on an actual device.

It should be noted that the drawings are not true to scale. Moreover, in the drawings, heavily doped regions (typically concentrations of impurities of at least $1\times10^{19}$ impurities/$cm^3$) are designated by a plus sign (e.g., $n^+$ or $p^+$) and lightly doped regions (typically concentrations of no more than about $5\times10^{16}$ impurities/$cm^3$) by a minus sign (e.g. $p^-$ or $n^-$).

Moreover, while the present invention is illustrated by preferred embodiments directed to silicon semiconductor devices, it is not intended that these illustration be a limitation on the scope or applicability of the present invention. It is not intended that the semiconductor devices of the present invention be limited to the physical structures illustrated. These structures are included to demonstrate the utility and application of the present invention to presently preferred embodiments.

Active area component, e.g. the source and drain, isolation of a MOSFET (metal oxide semiconductor field effect transistor) is conventionally accomplished by using two mask layers, an island layer and a gate layer. The island layer is used to form an opening within thick field oxide grouse on a substrate. The gate layer is used to create the gate of the transistor and forms the self-aligned and separate active areas (the source and drain) of the transistor within the island opening of the thick field oxide.

FIG. 1 is an exemplary cross-section of a conventional integrated circuit 11 that combines a transistor and ejection element. A substrate 10, preferably silicon though other substrates known to those skilled in the art can be used and still meet the spirit and scope of the invention, is processed using conventional integrated circuit processes. The substrate 10 is preferably doped with a p− dopant for an NMOS process; however, it can also be doped with an n− dopant for a PMOS process. The substrate 10 has an ejection element 20 disposed over the substrate with an intervening field oxide layer 12 providing thermal isolation of the ejection element 20 to the substrate 10. Optionally, additional deposited oxide layers may be disposed on the field oxide layer 12. The ejection element 20 is coupled to a transistor 30, preferably an N-MOS transistor, formed in the substrate 10. The coupling is preferably done using a conductive layer 21, such as aluminum, although other conductors can be used such as copper and gold, to name a couple. The transistor 30 includes a source active region 18 and a drain active region 16 and a gate 14. The ejection element 20 is made from a resistive conductive layer 19 that is deposited on the field oxide layer 12. The area of an opening in the conductive layer 21 defines the ejection element 20. To protect the ejection element 20 from the reactive qualities of fluid to be ejected, such as ink, a passivation layer 22 is disposed over the ejection element 20 and other thin-film layers that have been deposited on the substrate 10. To create a printhead, the integrated circuit 11 is combined with an orifice layer 82, shown as a fluid barrier 26 and an orifice plate 28. The ejection element 20 and the passivation layer 22 are protected from damage due to bubble collapse in fluid chamber 92 after fluid ejection from nozzle 90 by a cavitation layer 24 that is disposed over passivation layer 22. The stacks of thin-film layers 32 that are disposed on substrate 10 are those layers processed on the substrate 10 before applying the orifice layer 82. Optionally, the orifice layer 82 can be a single or multiple layer(s) of polymer or epoxy material. Several methods for creating the orifice layer are known to those skilled in the art.

In the embodiments of the invention, unlike a conventional process, no island mask is used to form the transistor. Also, the field oxide dielectric layer is not grown on the substrate. Instead, the gate mask is modified to form closed-loop gate structures to accomplish all the isolations required to create the transistors. By using a closed-loop gate structure, the drain active area of the transistor is enclosed by the gate of the transistor. The area outside of the closed-loop gate is the source active area of the transistor. This gate layout technique allows for the creation of a new process flow for creating an integrated circuit that does not require the active level mask, two furnace operations, and several other process steps, including but not limited to, field oxidation, nitride deposition, and a plasma etch step. Thus, one benefit of the invention is the reduction of multiple processing steps compared to conventional MOS process flows prior to gate oxidation. An exemplary conventional process includes the steps of pre-pad oxidation clean, pad oxidation, nitride deposition, active photolithography, active etch, resist removal, pre-field oxidation clean, field oxidation, deglaze, nitride strip, and pre-gate oxidation clean before growing the thermal gate oxide. All of these steps of the exemplary conventional process are eliminated when using a process to make embodiments of the invention. Since the active layer photolithography is eliminated, one reduces the total number of mask levels used. In addition, to compensate for the lack of the thick field oxide layer in a process used to make embodiments of the invention, a dielectric layer of preferably phosphosilicate glass is applied, preferably by deposition, to a thickness of at least 2000 Angstroms but preferably between 6000 to 12,000 Angstroms or greater. Because of the resulting thinner dielectric layer due to the lack of field oxide and different etch properties, the contact etch step in the conventional process is preferably changed to a shorter time period to prevent over-etching. For example, if the conventional contact etch process time was 210 seconds, the new contact etch process time is preferably 120 seconds.

FIG. 2 is an exemplary cross-section of an embodiment of an integrated circuit (IC) 117 incorporating the invention. In this embodiment, the gate 114 of the transistor is shown in two sections that in actuality are connected in a closed-loop manner outside of this view (see FIG. 5). In this embodiment, each transistor 130 on IC 117 is formed using a closed-loop gate structure to isolate the drain 116 of the transistor 130 A within the inner portion of the closed-loop. The source 118 of the transistor 130 is outside of the closed-loop gate. In this embodiment, no field oxide is grown on the substrate 110 and no island mask is used to define the drain 116 and source 118 active areas. To make up for the lack of field oxide growth, a dielectric layer 136 is deposited to at least 2000 Angstroms but preferably to a thickness of between about 6000 to about 12,000 Angstroms or greater, preferably of phosphosilicate glass, to provide for thermal isolation between the ejection element 120 and the substrate 110. A first contact 123 is made in the dielectric layer 136 to allow the conductive layer 121 to make contact to the drain 116 of the transistor 130 that is further coupled to the ejection element 120. Also, a second contact 125 is made in the dielectric layer 136 to allow the conductor layer 121 make contact with the gate 114 of the transistor 130.

FIG. 3 is an exemplary cross-section of an alternative embodiment of the invention in which a substrate body contact 113 is used within integrated circuit 117 to connect to the bulk (backgates or bodies) of the transistors formed in the substrate. In this embodiment, an additional mask layer for a substrate contact is used to pattern and etch through a polysilicon pad 129 and gate oxide 115 that are used to block the doping of a global active area 118 beneath the polysilicon pad 129. This allows the substrate beneath the polysilicon pad 129 to remain undoped during active area formation. Thus, the substrate contact 113 to the substrate 110 can be directly tied preferably to ground for an N-MOS circuit or VDD power for a P-MOS circuit. In this exemplary embodiment, the substrate contact 113 is made using the subsequently applied cavitation layer 124, preferably tantalum, which rests on top of passivation layer 122 and dielectric layer 136.

It should be noted that conventional MOS integrated circuits bias the bulk (backgates or bodies) of the transistors formed in the substrate either to ground potential for N-MOS or VDD potential for P-MOS. This biasing is done to discharge background junction leakage and any injected substrate current during dynamic transistor operation. By removing the field oxide isolation and having the non-poly areas of the substrate doped n+ for NMOS, p+ for PMOS, one way to establish a direct substrate body contact is to create a poly pad 129 (FIG. 3) to prevent doping active area beneath it and then creating a substrate contact 113 through the poly pad 129 and gate oxide 115 to the substrate. To do so requires the use of a separate substrate contact mask that increases the cost and complexity of the process.

To prevent this additional cost, one option is to not connect the substrate body 127 (and hence) the body of the transistors to ground potential. By not connecting the substrate body 127 to ground 64. the substrate body 127 is allowed to float due to leakage and stray currents. For NMOS and a p− substrate body, the substrate body 127 is ideally non-positive With respect to the source and drain regions of the transistor to keep the inherent isolation diodes (substrate to active source, drain areas) reversed bias. While ideally the substrate body 127 of the substrate 110 is biased at ground potential for an N-MOS integrated circuit (VDD for a P-MOS circuit), the actual voltage of the substrate body 127 can change the current-voltage characteristics of the transistors slightly by affecting the gate $V_t$ (voltage threshold turn-on) potential. Because the modified process allows large amounts of ground potential junction active area to be strapped to ground, the charge accumulation in the substrate body 127 is minimized because the substrate charge creates a forward biased p−n+ junction between the body and active area thus indirectly connecting the substrate body 127 to ground 56 over a substantial portion of the integrated circuit. If leakage current into the substrate body 127 raises the body potential, the ground potential junction active area limits the body voltage increase to less than one diode drop. The affect of an increase in body potential is to reduce the $V_t$ voltage required to turn on the transistors. This slight increase is normally not a problem as a typical $V_t$ of an N-MOS transistor whose body is directly grounded is approximately 0.8 to 1.2 volts. Thus, a slight reduction of $V_t$ will not generally affect the operation of digital circuits. Therefore, the substrate contacts 113 to the substrate body 127 (FIG. 3) can be eliminated entirely thereby further reducing process steps and manufacturing costs. Functional tests and empirical testing have shown that no differences in yield or fluid cartridge performance between integrated circuits and printheads embodying the invention that are built with and without a substrate connection.

FIG. 4 is an exemplary schematic of a transistor circuit used to selectively control an ejection element 120 shown as $R_{ij}$ as one of a matrix of ejection elements on a printhead. Although there are several other circuits that could be used to control the ejection element 120, this circuit is provided to demonstrate several advantageous aspects of the invention. The ejection element 120 is coupled to a primitive driveline 46 and to the drain of T1 transistor 130. The source of T1 transistor 130 is connected to ground 64. The gate of T1 transistor 130 is connected to the source of T2 transistor 42 and the drain of T3 transistor 40. The source of T3 transistor 40 is connected to ground 64. The gate of T3 transistor 40 is coupled to an enableB signal 50. The gate of T2 transistor 42 is coupled to an enableA signal 44. The drain of T2 transistor 42 is connected to address select signal 48

Figure 5:
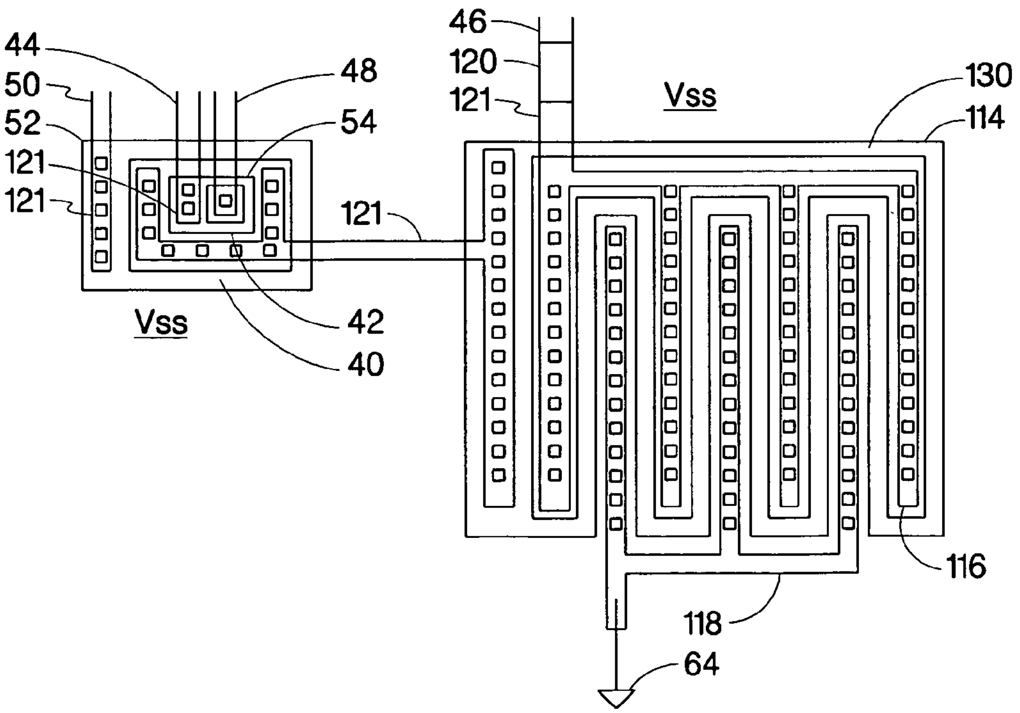
FIG. 5 is an exemplary mask layout of the exemplary schematic of FIG. 4 and embodying aspects of the invention.

FIG. 5 is an exemplary mask layout of the exemplary schematic of FIG. 4 and embodies aspects of the invention. The gate 114 of T1 transistor 130 is formed as a serpentine closed-loop structure in order to increase the length of the gate to create a lower on-resistance transistor. Within the closed-loop, the drain 116 is contacted with a conductive layer 121 to connect to ejection element 120. Outside of the closed-loop, the source 118 is connected with another conductive layer to ground 64. The gate 114 of T1 transistor 130 is coupled to the inside of the closed-loop gate of T3 transistor 40, which is its drain. Also within the closed-loop gate 52 of T3 transistor 40 is the closed-loop gate of T2 transistor 42. By placing the T2 transistor 42 within the inside active area of T3 transistor 40 the source of T3 transistor 40 is intrinsically coupled to the drain of T2 transistor 42. The gate 52 of T3 transistor 40 is coupled to enableB signal 50. The gate 54 of T2 transistor 42 is coupled to enableA signal 44. The inside of the closed-loop gate 54 of T2 transistor 42, its drain, is coupled to the address select signal 48.

Figure 6:
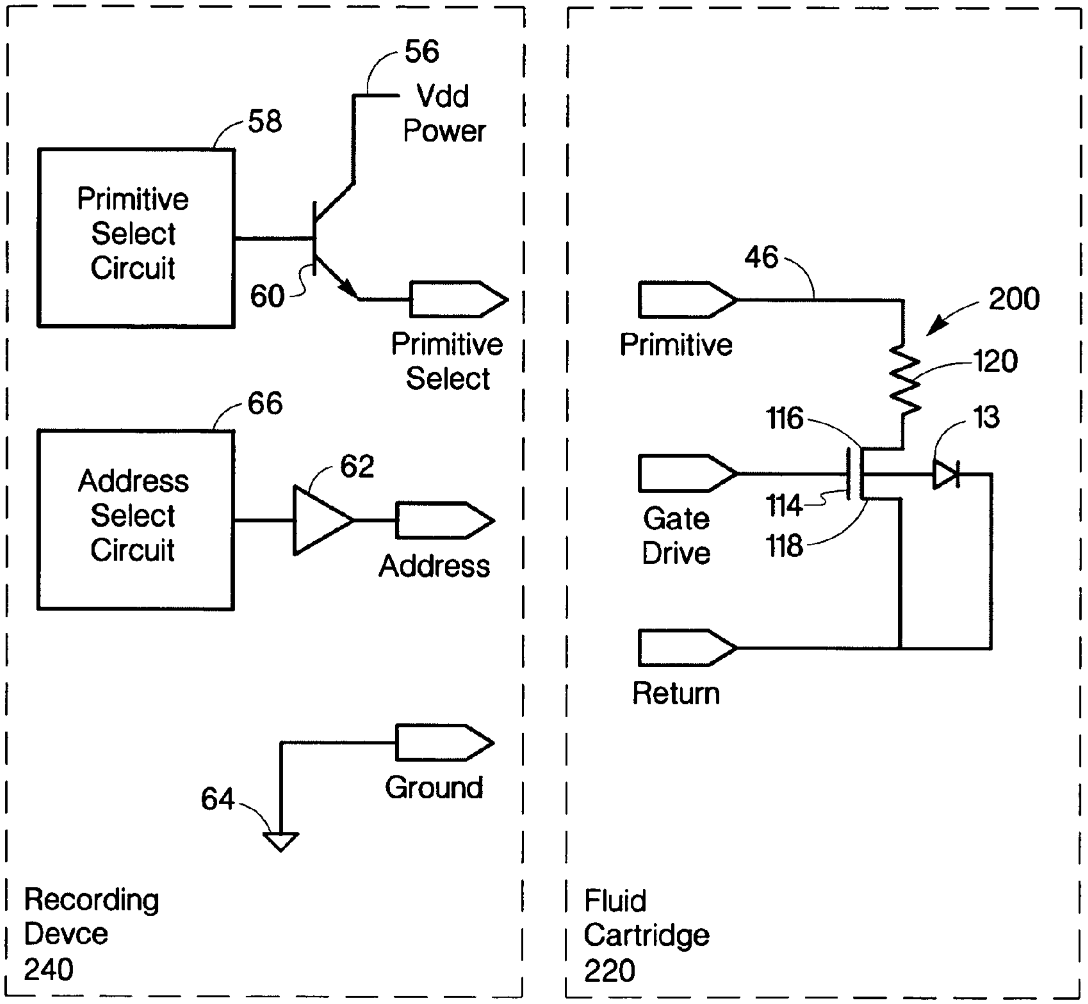
FIG. 6 is an exemplary schematic illustrating the electrical interface between a recording device and a printhead integrated circuit on a fluid cartridge that combines a transistor with an ejection element.

FIG. 6 is an exemplary schematic illustrating an electrical interface between a recording device and an integrated circuit that combines a transistor 130 with an ejection element 120. In this example, no substrate contact to ground potential is made. The bulk of transistor 130 is shown as having an inherent diode 13 between the bulk and the source 118 connections. In this example, the drain 116 of transistor 130 is coupled to an ejection element 120, a heater resistor. The heater resistor is further connected to a primitive driveline 46. A primitive is a grouping of ejection elements, such as a column of one color in printhead. Thus, the primitive signal interface 46, the gate 114 of the transistor 130 and the source 118 of the transistor 130 form external interface ports (such as contacts 214 in FIG. 9) that a recording device can control. The recording device 240 (see FIG. 10) includes a primitive select circuit 58 that controls power 56 via a switch 60 to preferably a group of ejection elements (a primitive) on the integrated circuit 200 (see FIG. 8). The recording device 240 also includes an address select circuit 66 that interfaces to a driver 62 that selects an individual ejection element within a primitive.

For an exemplary process that incorporates the invention, a MOS integrated circuit with an ejection element can be fabricated with only 7 masks if the substrate contact is not used or 8 masks if the substrate contract is used. To make a printhead the integrated circuit is processed to provide protective layers and an orifice layer on the stack of previously applied thin-film layers. Various methods exist and are known to those skilled in the art to form an orifice layer. For an exemplary process the mask layers labels represent the following major thin-film layers or functions. The masks are labeled (in the order preferably used) as gate, contact, substrate contact (optional), metal1, sloped metal etch, via, cavitation, and metal2.

Figure 7:
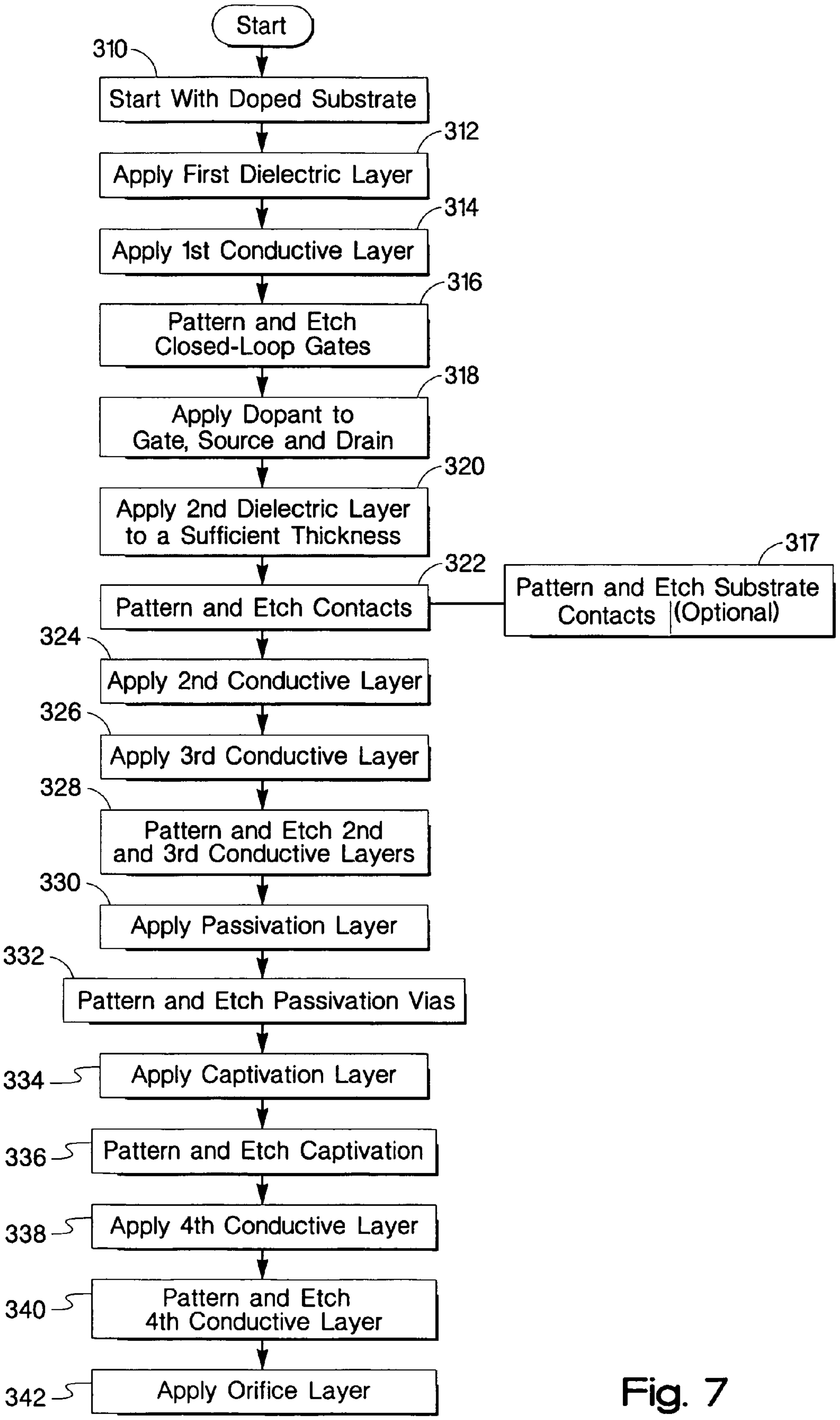
FIG. 7 is an exemplary flow chart of a process used to create an integrated circuit that embodies aspects of the invention.

FIG. 7 is an exemplary flow chart of a process used to create an integrated circuit that embodies aspects of the invention. In block 310, the process begins with a doped substrate, preferably a p− doped substrate for N-MOS, and an n− doped substrate for PMOS. In a conventional process, the major steps of defining active areas and growing field oxide would be performed. In the process of the invention, the conventional steps of defining of the active areas with an active mask and field oxide growth are eliminated. In block 312, a first dielectric layer of gate oxide is applied on the doped substrate. Preferably, a layer of silicon dioxide is formed to create the gate oxide. Alternatively, the gate oxide can be formed from several layers such as a layer of silicon nitride and a layer of silicon dioxide. Additionally, several different methods of applying the gate oxide are known to those skilled in the art. In block 314, a first conductive layer is applied, preferably a deposition of polycrystalline silicon (polysilicon), and patterned with the gate mask and wet or dry etched in block 316 in closed-loop structures to form the gate regions from the remaining first conductive layer, the drain of the transistors formed within the closed-loop and the source of the transistors in the area outside of the closed-loop structures. In block 318, a dopant concentration is applied in the areas of the substrate that is not obstructed by the first conductive layer to create the active regions of the transistors. A substantial portion of the substrate surface will be created as active region because no island mask is used. In block 320, a second dielectric layer, preferably phosphosilicate glass (PSG) is applied to a predetermined thickness (at least 2000 but preferably between about 6000 to about 12,000 Angstroms or greater) to provide sufficient thermal isolation between a later formed ejection element and the substrate 110. Preferably, after the PSG is applied, it is densified. Optionally, before applying the second dielectric layer, a thin layer of thermal oxide can be applied over the source, drain and gate of the transistor, preferably to a thickness of about 50 to 2,000 Angstroms but preferably 1000 Angstroms. In block 322, a first set of contact regions is created in the second dielectric layer using the contact mask to form openings to the first conductive layer and/or the active regions of the transistors. Optionally in block 317, a second etch step is used with the optional substrate contact mask to pattern and etch substrate body contacts. In block 324, a second conductive layer, preferably an electrically resistive layer such as tantalum aluminum, is applied by deposition. Optionally, the second conductive layer is formed of polycrystalline silicon (polysilicon). The second conductive layer is used to create the ejection element. In block 326, a third conductive layer, such as aluminum, is applied, preferably by deposition or sputtering. In block 328 the third conductive layer is patterned with the metal1 mask and etch to form metal traces for interconnections. The third conductive layer is used to connect the active regions of the transistors to the ejection elements. The third conductive layer is also used to connect various signals from the first conductive layer to active area regions. To convert the integrated circuit to a printhead further steps combine printhead thin-film protective materials and a conductive layer to interface with the integrated circuit thin-films. In block 330, a layer of passivation is applied over the previously applied layers on the substrate. In block 332, using the via mask, the passivation layer is patterned and etched to create a second set of contact regions in the passivation layer to the third conductive layer. Preferably the protective passivation layer is made up of a layer of silicon nitride and a layer of silicon carbide. In block 334, a protective cavitation layer is applied, preferably tantalum, tungsten, or molybdenum. In block 336, the cavitation layer is patterned with the cavitation mask and etched. In block 338, a fourth conductive layer, preferably gold, deposited or sputtered. The fourth conductive layer is patterned with the metal2 mask in block 340 and etched to create conductive traces. The fourth conductive layer traces are used to make contact with the third conductive layer through the second set of contact regions in the passivation layer. External signals to operate the printhead make contact to the fourth conductive layer. In step 342, an orifice layer is applied over the surface of the previously applied stack of thin-film layers on the substrate. The orifice layer is made of one or more layers. One option is to provide a protective barrier layer to define fluid wells (fluid receiving cavities) coupled to the ejection elements, and then applying an orifice plate with nozzles defined therein over the fluid wells for directing any ejected fluid from the printhead. Another option is to apply a photolithographic polymer or epoxy material that can be exposed and developed to form the fluid well and nozzles. The polymer or epoxy material can be made of one or more layers.

Figure 8:
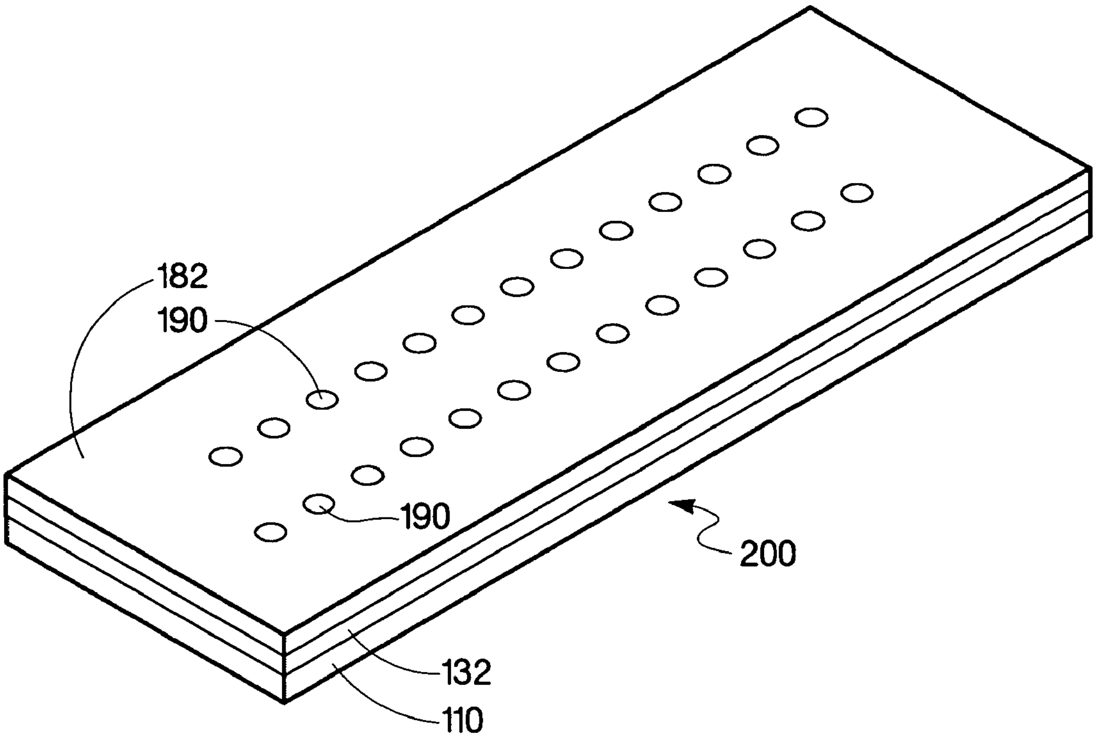
FIG. 8 is an exemplary perspective diagram of a printhead that is made from an integrated circuit embodying the invention.

FIG. 8 is an exemplary prospective view of an integrated circuit, a fluid jet printhead 200, which embodies the invention. Disposed on substrate 110 is a stack of thin-film layers 132 that make up the circuitry illustrated in FIG. 5. Disposed on the surface of the integrated circuit is an orifice layer 182 that defines at least one opening 190 for ejecting fluid. The opening(s) is fluidically coupled to the ejection elements(s) 120 (not shown) of FIG. 2. Preferably, the ejection elements 120 are positioned beneath and in alignment with the fluid wells in order to impart energy to fluid within the fluid wells.

Figure 9:
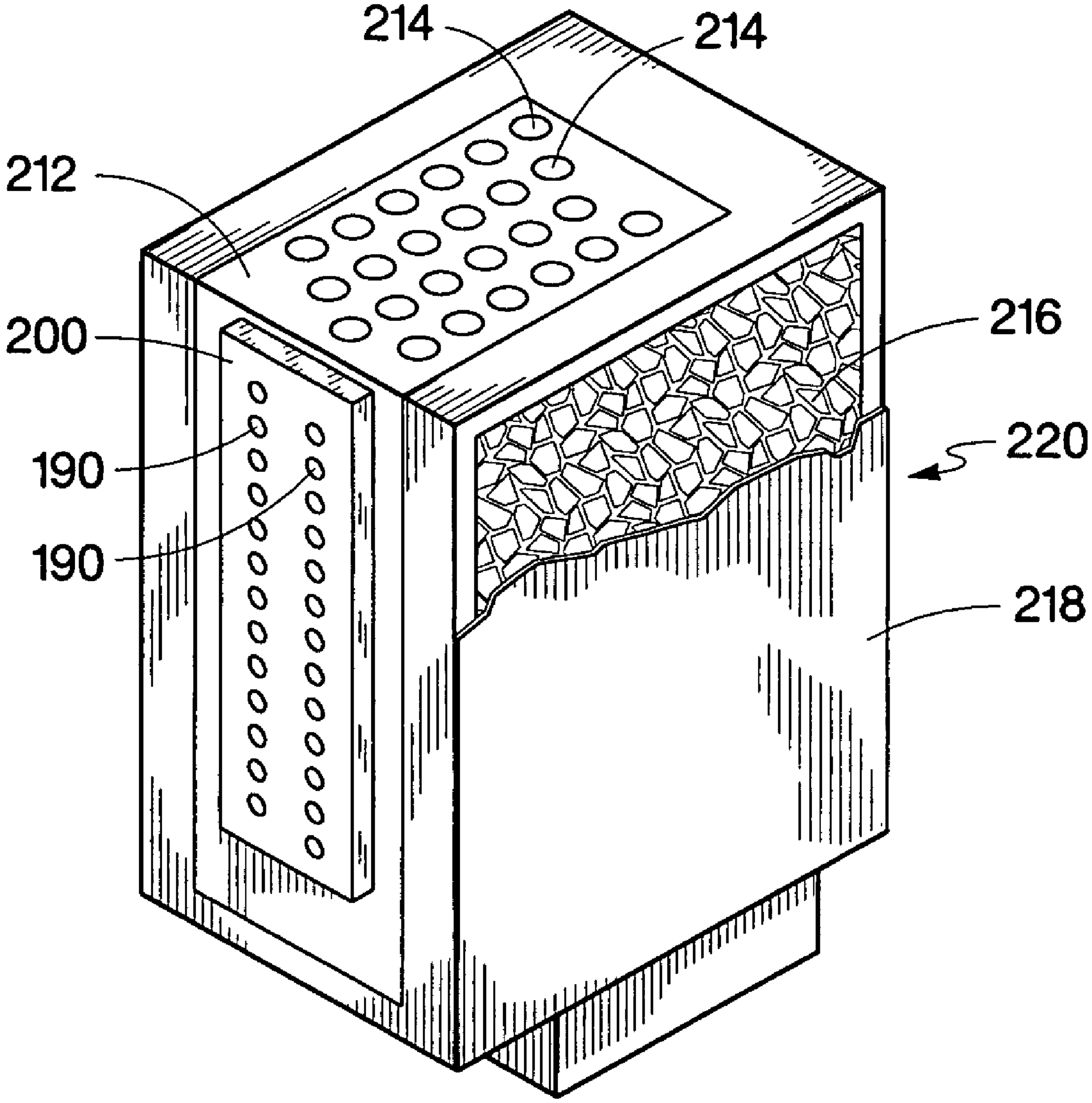
FIG. 9 is an exemplary fluid cartridge incorporating the exemplary printhead of FIG. 8.

FIG. 9 is an exemplary fluid cartridge 220 that incorporates the fluid jet printhead 200 of FIG. 8. The fluid cartridge 220 has a body 218 that defines a fluid reservoir. The fluid reservoir is fluidically coupled to the openings 190 in the orifice layer 182 of the fluid jet printhead 200. The fluid cartridge 220 has a pressure regulator 216, illustrated as a closed foam sponge to prevent the fluid within the reservoir from drooling out of the opening 190. The energy dissipation elements 120 (see FIG. 2) in the fluid jet printhead 200 are connected to contacts 214 using a flex circuit 212.

Figure 10:
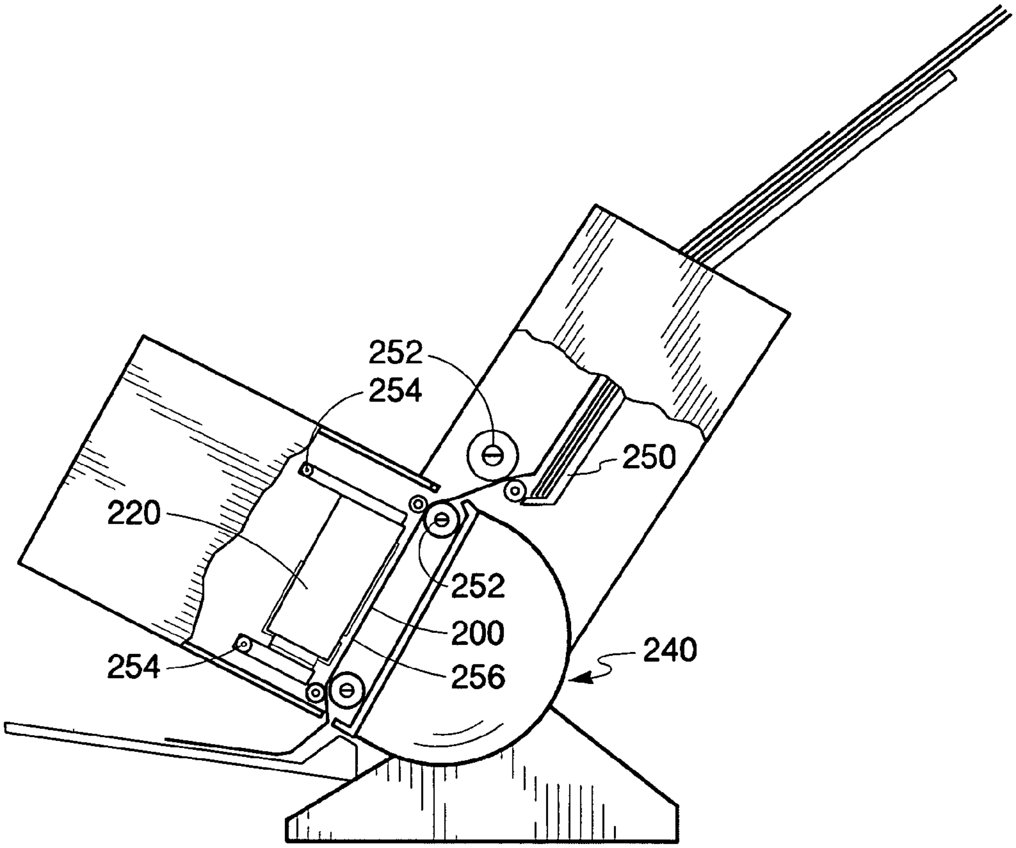
FIG. 10 is an exemplary recording device that incorporates the exemplary recording cartridge of FIG. 9.

FIG. 10 is an exemplary recording device 240 that uses the fluid cartridge 220 of FIG. 9. The recording device 240 includes a medium tray 250 for holding media. The recording device 240 has a first transport mechanism 252 to move a medium 256 from the medium tray 250 across a first direction of the fluid jet printhead 200 on the fluid cartridge 220. The recording device 240 optionally has a second transport mechanism 254 that holds the fluid cartridge 220 and transports the recording cartridge 220 in a second direction, preferably orthogonal to the first direction, across the medium 256.

What is claimed is:

1. A method of creating an integrated circuit having a combined transistor and an ejection element, comprising the steps of:

- applying a first dielectric layer on a substrate to form a gate oxide excluding the steps of a) thermally growing a field oxide layer, and b) creating an island opening in the field oxide layer using an island mask;
- applying a first conductive layer of closed loops to define gate regions of transistors;
- applying a dopant concentration in the areas of the substrate not obstructed by the first conductive layer to create active regions of the transistor;
- applying a second dielectric layer to a thickness to provide thermal isolation between the ejection element and the substrate;
- creating a first set of contact regions in the second dielectric layer;
- applying a second conductive layer used to create the ejection element; and applying a third conductive layer to connect the active regions of the transistor to the ejection element.

2. The method of claim 1 further comprising the step of creating a second set of contact regions in the first conductive layer and first dielectric layer.

3. A method of creating an integrated circuit having a transistor and an ejection element, comprising the steps of:

applying a gate oxide on the substrate excluding the steps of a) thermally growing a field oxide layer, and b) creating an island opening in the field oxide layer using an island mask;

applying a first conductive layer on the gate oxide;

using a gate mask having closed loop structures to create transistor gates in the first conductive layer;

applying a dopant concentration in the areas of the substrate not obstructed by the first conductive layer to create active regions of the transistor;

applying a dielectric layer to a thickness to provide a thermal isolation layer between the substrate and the ejection element;

using a contact mask to etch a first set of contact regions in the dielectric layer;

applying a second conductive layer having a high resistance;

applying a third conductive layer having a low resistance on the first conductive layer;

using a metal1 mask to define conductive traces and the ejection element by etching the third conductive layer;

applying a passivation layer on the substrate;

using a via mask to etch a second set of contact regions in the passivation layer;

depositing a cavitation layer on the substrate;

using a cavitation mask to pattern and etch the cavitation layer;

applying a fourth conductive layer on the substrate; and using a metal2 mask to pattern and etch the fourth conductive layer to form conductive traces.

4. The method of claim 3 further comprising the step of forming a plurality of openings through the layer of first conductive layer and gate oxide in order to provide access to the substrate.

5. A method of creating an integrated circuit, comprising:

applying a gate oxide layer on a substrate;

applying a first gate layer of closed loops on the gate oxide layer to accomplish all the isolations required to create a set of transistors without an island mask;

applying a dopant concentration in the areas of the substrate not obstructed by the first gate layer;

applying a dielectric layer to a thickness to provide thermal isolation between a set of ejection elements and the substrate;

creating a first set of contact regions in the dielectric layer;

applying a resistive layer used to create the set of ejection elements; and is applying a conductive layer to interconnect active regions of the set of transistors to the set of ejection elements.

6. The method of claim 5 further comprising creating a second set of contact regions in the first gate layer and gate oxide layer.

* * * * *

UNITED STATES PATENT AND TRADEMARK OFFICE

CERTIFICATE OF CORRECTION

PATENT NO. : 6,977,185 B2
APPLICATION NO. : 10/214081
DATED : December 20, 2005
INVENTOR(S) : Bryant et al.

It is certified that error appears in the above-identified patent and that said Letters Patent is hereby corrected as shown below:

Col. 10 (line 24), delete “is”.

Signed and Sealed this

Eighth Day of August, 2006

JON W. DUDAS
*Director of the United States Patent and Trademark Office*